(12) United States Patent
Wenzeis

(10) Patent No.: US 11,655,541 B2
(45) Date of Patent: May 23, 2023

(54) PROCESS FOR PRODUCING POLYCRYSTALLINE SILICON

(71) Applicant: WACKER CHEMIE AG, Munich (DE)

(72) Inventor: Markus Wenzeis, Wurmannsquick (DE)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 17/294,772

(22) PCT Filed: Dec. 17, 2018

(86) PCT No.: PCT/EP2018/085306
§ 371 (c)(1),
(2) Date: May 18, 2021

(87) PCT Pub. No.: WO2020/125932
PCT Pub. Date: Jun. 25, 2020

(65) Prior Publication Data
US 2022/0010434 A1    Jan. 13, 2022

(51) Int. Cl.
*C23C 16/52* (2006.01)
*C01B 33/03* (2006.01)
*C23C 16/24* (2006.01)

(52) U.S. Cl.
CPC .............. *C23C 16/52* (2013.01); *C01B 33/03* (2013.01); *C23C 16/24* (2013.01)

(58) Field of Classification Search
None
See application file for complete search history.

(56) References Cited

U.S. PATENT DOCUMENTS

| | | | |
|---|---|---|---|
| 2003/0205326 A1* | 11/2003 | Miya | C23C 16/52 156/345.47 |
| 2012/0100302 A1 | 4/2012 | Fabry et al. | |
| 2013/0011581 A1* | 1/2013 | Muller | C01B 33/035 118/500 |
| 2013/0129570 A1 | 5/2013 | Jung et al. | |
| 2015/0217252 A1 | 8/2015 | Bucci et al. | |
| 2015/0364323 A1* | 12/2015 | Mueller | C01B 33/035 438/488 |

FOREIGN PATENT DOCUMENTS

| | | |
|---|---|---|
| CN | 102381709 A | 3/2012 |
| EP | 2077252 A2 | 7/2009 |
| EP | 2444373 A1 | 4/2012 |
| EP | 2594933 A1 | 5/2013 |
| JP | 2015048295 A | 3/2015 |
| KR | 20150093209 A | 8/2015 |
| TW | 201417887 A | 5/2014 |
| TW | 201505966 A | 2/2015 |
| WO | 9736822 A1 | 10/1997 |

* cited by examiner

*Primary Examiner* — Joel G Horning
(74) *Attorney, Agent, or Firm* — Brooks Kushman P.C.

(57) ABSTRACT

Polycrystalline silicon is produced in a chemical vapour deposition reactor, wherein, outside the reactor at at least one position on at least one reactor component, vibrations of the reactor are measured using a measurement device and optionally recorded. The vibrations may be used to identify rod fall over and other events occurring within the reactor.

8 Claims, 2 Drawing Sheets

PROCESS FOR PRODUCING POLYCRYSTALLINE SILICON

CROSS REFERENCE TO RELATED APPLICATIONS

This application is the U.S. National Phase of PCT Appln. No. PCT/EP2018/085306 filed Dec. 17, 2018, the disclosure of which is incorporated in its entirety by reference herein.

BACKGROUND OF THE INVENTION

1. Field of the Invention

The invention relates to a method for producing polycrystalline silicon in a chemical vapour deposition reactor, wherein, outside the reactor at at least one position in at least one reactor component, vibrations of the reactor are measured using a measurement device and optionally recorded. The invention further provides a reactor, in particular for carrying out the method.

2. Description of the Related Art

Polycrystalline silicon (polysilicon) serves as a starting material in the production of monocrystalline silicon, for example by means of crucible pulling (Czochralski process) or by means of zone melting (float zone process). The monocrystalline silicon can be sawn into slices (wafers) and after a multiplicity of further processing steps can be used in the semiconductor industry for the manufacture of electronic components (chips). Polysilicon is also a starting material in the production of multicrystalline silicon, for example by means of the block casting process. The multicrystalline silicon, obtained in the form of a block, can be used for the manufacture of solar cells.

Polysilicon can be obtained by the Siemens process—a chemical vapour deposition process. This involves heating support bodies (usually composed of polysilicon) in a bell-shaped reactor (Siemens reactor) by way of the direct passage of current and introducing a reaction gas comprising a silicon-containing component and hydrogen. The silicon-containing component is generally monosilane ($SiH_4$) or a halosilane of the general composition $SiH_nX_{4-n}$ (n=0, 1, 2, 3; X=Cl, Br, I). It is typically a chlorosilane or a chlorosilane mixture, usually trichlorosilane ($SiHCl_3$, TCS). Predominantly, $SiH_4$ or $SiHCl_3$ is used in a mixture with hydrogen. The structure of a typical Siemens reactor is described by way of example in EP 2 077 252 A2 or EP 2 444 373 A1. The bottom of the reactor (bottom plate) is generally provided with electrodes that accommodate the support bodies. The support bodies are customarily thin filament rods (thin rods) made of silicon. Typically, two filament rods are connected via a bridge (made of silicon) to form a pair that forms a circuit via the electrodes. The surface temperature of the filament rods is typically more than 1000° C. At these temperatures, the silicon-containing component of the reaction gas decomposes and elemental silicon is deposited from the vapour phase as polysilicon. The diameter of the filament rods and of the bridge increases as a result. After reaching a predetermined diameter of the rods, the deposition is usually stopped and the polysilicon rods obtained are removed. After the removal of the bridge, approximately cylindrical silicon rods are obtained.

The growing polysilicon rods, which become increasingly heavy during the course of the method, are held only by the electrodes (usually in combination with an electrode holder). Depending on the target diameter (usually 90 to 190 mm) and length of the filament rods (generally between 1.5 and 3.5 m), rod weights of 50 to 400 kg (per rod and without bridge) may be reached. A support body made of two rods and a bridge can therefore weigh almost one metric ton in modern reactors. In principle, longer filament rods in combination with larger target diameters increase the yield per batch and hence generally also the economic viability of the deposition process. However, the risk of the support bodies falling over also increases.

Since, by way of example, 24 support bodies (48 rods) can nowadays be arranged in deposition reactors, just one support body falling over can trigger a "domino effect." This can cause considerable economic losses, especially if the reactor walls are damaged. The silicon rods that have fallen over are generally also contaminated, and after removal the batch has to be subjected to an additional cleaning step and/or assigned to a lower quality class.

A further problem is the time-consuming and dangerous removal of batches which contain support bodies that have fallen over. Firstly, it cannot always be identified prior to the removal whether there are any support bodies present that have fallen over, which presents a considerable risk when lifting off the reactor bell jar (reactor shell). Secondly, the recovery of the silicon rods that have fallen over, and are possibly broken, is associated with considerable apparatus and time demands, since additional contamination is to be avoided. Cleaning of the reactor, especially the removal of silicon splinters, requires additional hours of labour. Overall, the downtime of a deposition reactor therefore increases if support bodies fall over.

These problems gave rise to the object of the invention, specifically that of providing a method with which firstly the downtime of deposition reactors having batches that have fallen over can be shortened, and with which secondly the risk during removal can be reduced.

SUMMARY OF THE INVENTION

These and other objects are achieved by a method for producing polysilicon, comprising introducing a reaction gas containing hydrogen and silane and/or halosilane into a reaction space of a chemical vapour deposition reactor, wherein the reaction space comprises at least one heated support body on which elemental silicon is deposited by means of chemical vapour deposition to form the polysilicon. At the same time, outside the reaction space at at least one position of at least one reactor component, vibrations of the reactor are measured using a measurement device and optionally recorded.

BRIEF DESCRIPTION TO THE DRAWINGS

Figure 1:
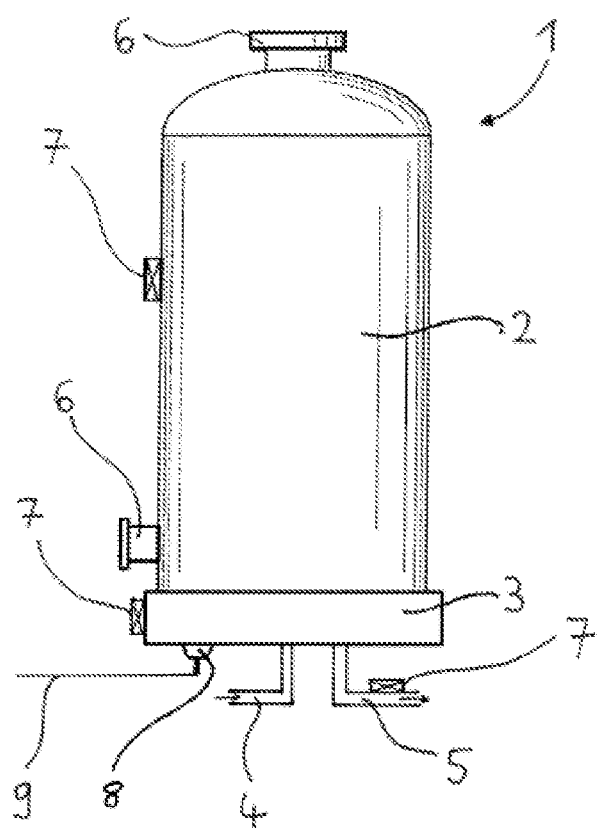
FIG. 1 schematically shows a reactor according to the invention.

The chemical vapour deposition reactor is especially a Siemens reactor as has been described above. Accordingly, the support body preferably comprises two filament rods which are made of silicon, are connected via a bridge made of silicon to form a rod pair, and thus have approximately the form of an upturned "U". The free ends of the filament rods are connected to electrodes of a bottom plate of the reactor.

The number of silicon rods/silicon rod pairs arranged in the reactor is generally unimportant for the execution of the method according to the invention. Typical examples of the number of silicon rods in a reactor are 24 (12 rod pairs), 36 (18 rod pairs), 48 (24 rod pairs), 54 (27 rod pairs), 72 (36 rod pairs) or 96 (48 rod pairs). The silicon rods can be considered to be cylindrical as a good approximation. This approximation is justified as modern Siemens reactors are designed in principle for ensuring maximum homogeneity of deposition, that is to say for generating silicon rods of identical quality and form. This is achieved in particular by way of a homogeneous gas flow within the reactor and by way of an essentially symmetrical arrangement of the rods. The filament rods may likewise be configured cylindrically, but other geometries are also possible.

It has been found that irregularities in the course of the deposition process can be detected outside of the reactor by means of sound/vibration measurements. Such irregularities can in particular be events of support bodies falling over. A falling-over event may be either an instance of complete falling over of a support body onto the reactor bottom, or else a leaning of a support body against another support body or against an inner reactor wall. The leaning of one support body against another one can often trigger an entire cascade of further falling-over events (domino effect). The irregularities may in addition also be a flaking off of silicon pieces or a breaking off of the bridge. All events that trigger mechanical vibrations are considered in principle.

The vibration measurement makes it possible to detect these irregularities immediately after they have arisen. In particular, using the intensity and the duration of the measured signal, the nature of the irregularities can be identified. For example, a distinction can be made between a support body which has fallen over and one which is leaning. As a consequence of this early detection, measures can be immediately taken or introduced. By way of example, the gas velocity can be adapted to the new situation. The deposition process can also be stopped and it is possible to immediately start with making preparations for removing the support bodies which have fallen over, which not only shortens the downtime of the reactor but also reduces the risk for personnel to a minimum when raising the reactor bell jar.

The vibrations to be measured can be the structure-borne sound of the reactor component. Structure-borne sound is mechanical vibration that propagates in the reactor component (solid body) and lead to an acceleration of the surface of the component. The measurement is therefore fundamentally effected in contact with the surface of the component. Preferably, contact microphones, microphones for structure-borne sound and/or pick-ups for structure-borne sound (sound pick-ups), which can be combined under the generic term "acceleration sensors", are used for the measurement. Acceleration sensors generally use the piezoelectric effect in order to convert the acceleration into electrical signals.

The vibrations to be measured can also be airborne sound that is emitted by a vibrating reactor component. Accordingly, the measurement can be effected using microphones which convert the airborne sound into electrical signals. In general, the measurement is effected here in the immediate vicinity of the reactor component (e.g. 0.5 to 10 cm in front of it) in order to be able to better exclude (or filter out) background noises that are in principle unavoidable in a reactor hall.

The measurement device accordingly preferably comprises at least one acceleration sensor and/or at least one microphone.

The structure-borne sound measurement and the airborne sound measurement are particularly preferably combined. The airborne sound and the structure-borne sound are thus preferably measured at one or more positions in a reactor component. A plurality of reactor components can also be equipped with the measurement device.

The reactor component on which the vibration is measured is preferably selected from the group comprising reactor shell, bottom plate, conduit for gas supply, conduit for gas removal and electrode holder. This may generally be any reactor component on which a measurement device is mountable from the outside. A deposition reactor according to the invention is illustrated in FIG. 1 and will be described below.

The measurement device can also comprise a recording system. In particular, this is a piece of software which graphically depicts the sound converted into electrical signals and optionally records it over a period of time.

The measurement device is preferably coupled to a process control station. The coupling is effected in particular via the recording system. The recording system may optionally already be integrated into the process control station. By means of such a coupling, action can be taken directly upon the occurrence of a measurement signal. By way of example, it can initially be checked through a viewing window in the reactor shell whether a falling-over event has occurred.

The vibrations are preferably measured and recorded up until the completion of the deposition, especially up until opening of the reactor (generally by raising the reactor shell). The start of the recording is preferably when the reactor has been closed after installation of the support bodies, that is to say the reactor shell has been lowered onto the bottom plate of the reactor. In this way, irregularities can be detected throughout the deposition operations and optionally action can immediately be taken.

The result of recording the sound over the entire process duration is a sound or frequency spectrum of the deposition process or of the reactor. Sound spectra of this kind open up the possibility of comparing different deposition processes in order, for example, to identify repeating patterns that are indicative of the falling-over event even before it has actually happened. In this way, an instance of a support body falling over can potentially even still be avoided.

In the case of a threshold value of the measured vibrations being exceeded, the deposition can be interrupted or ended. When such a value is exceeded, an alarm signal can also initially be triggered. By way of example, a threshold value may be defined which is indicative of an extreme falling-over event (e.g. an instance of multiple support bodies falling over). Continuing the deposition in such a case is usually uneconomical, especially on account of the contamination of the polysilicon caused by the falling over.

In particular, it is possible by means of the duration and intensity of the measured vibrations to distinguish between one or more support bodies falling over. This can be effected, for example, by way of a comparison with reference measurements.

A further aspect of the invention relates to a chemical vapour deposition reactor, especially Siemens reactor, for the deposition of polysilicon, comprising, as reactor components, a base plate, a reactor shell arranged on the base plate, at least one conduit for gas supply, at least one conduit for gas removal, and electrode holders for at least one heatable support body on which the polysilicon is deposited. The reactor additionally comprises at least one measurement device for determining vibrations, which is mounted on one or more of the reactor components.

The reactor is especially suitable for carrying out the method according to the invention.

Reference can be made to the statements above with regard to the configuration of the measurement device.

FIG. 1 shows a chemical vapour deposition reactor 1 which comprises a reactor shell 2 arranged on a metallic bottom plate 3. The reactor shell 2 is usually likewise made of metal and water-cooled. The bottom plate 3 can also be cooled. Viewing windows 6 are integrated into the reactor shell 2 at the upper end and at the side, and enable a view into the reaction space and onto the support bodies arranged therein. A conduit 4 for gas supply and a conduit 5 for gas removal are indicated beneath the bottom plate 3. Conduit 4 is usually a constituent part of a gas distributor connected to a plurality of gas inlet nozzles in the interior of the reactor. An electrode holder 8 which is connected to the power supply 9 is also indicated. The electrode holder 8 is guided through the bottom plate 3 and connected to a filament rod of a support body. For reasons of clarity, the illustration of further electrode holders has been dispensed with. Acceleration sensors 7 are mounted on the reactor shell 2, the bottom plate 3 and the conduit 5 and relay their data to a recording system.

Example

Figure 2:
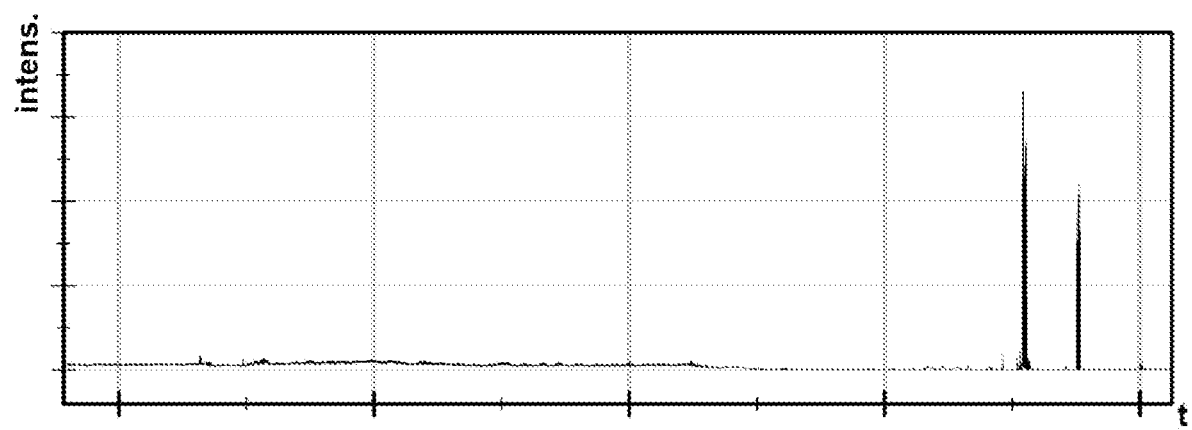
FIG. 2 shows a frequency spectrum recorded during the deposition.

FIG. 2 shows the excerpt from a frequency spectrum that was measured using an acceleration sensor (from PCB, triaxial accelerometer, 100 mV/g, ICP® (IEPE), 2 Hz-5 kHz) during a deposition process for the production of polysilicon. The vibration intensity (intens.) has in this case been plotted against the duration of the deposition (t). The intensity of the vibration is usually given in [m/s] and/or [m/s$^2$] in an acceleration sensor. In the present case, however, the value has been normalized in order to obtain a dimensionless measure for the intensity. The sensor was installed on the bottom plate.

The excerpt of the spectrum starts approximately 1 hour after the start of deposition and at first shows around 20 minutes before the detection of the two peaks at the right-hand end. The first peak, which is somewhat broader and more intense than the following one, is a leaning event that is directly followed by a falling over. This could be confirmed by visual inspection. Only a few minutes after this, leaning of one support body against another one occurred, which was likewise confirmed by visual inspection.

The example confirms that falling-over events, in particular, can be identified within a deposition reactor by means of a frequency spectrum. It is also possible to distinguish between different events.

The invention claimed is:

1. A method for producing polycrystalline silicon by the Siemens process, comprising introducing a reaction gas containing hydrogen and silane and/or halosilane into a reaction space of a Siemens chemical vapour deposition reactor, wherein the reaction space comprises at least one heated support body on which elemental silicon is deposited by means of chemical vapour deposition to form the polycrystalline silicon, wherein, outside the reaction space at at least one position of at least one reactor component, vibrations of the reactor are measured using a measurement device and optionally recorded, wherein the measurement device is coupled to a process control station, and wherein an instance of one or more support bodies falling over is determined by means of the duration and intensity of the measured vibrations.

2. The method of claim 1, wherein the vibrations are structure-borne sound of the reactor component.

3. The method of claim 1, wherein the vibrations are airborne sound.

4. The method of claim 1, wherein the measurement device comprises at least one acceleration sensor and/or at least one microphone.

5. The method of claim 1, wherein the reactor component is one or more of a reactor shell, a bottom plate, a conduit for gas supply or gas removal, or an electrode holder.

6. The method of claim 1, wherein the measurement device further comprises a recording system.

7. The method of claim 1, wherein vibrations are measured and recorded up until the completion of the deposition.

8. The method of claim 1, wherein vibrations are measured and recorded up until opening of the reactor.

* * * * *